United States Patent
Michishita et al.

(10) Patent No.: US 10,242,900 B2
(45) Date of Patent: Mar. 26, 2019

(54) STORAGE FACILITY FOR SEMICONDUCTOR CONTAINERS

(71) Applicant: Daifuku Co., Ltd., Osaka-shi (JP)

(72) Inventors: Daiki Michishita, Hinocho (JP); Miho Yamakawa, Hinocho (JP)

(73) Assignee: Daifuku Co., Ltd., Osaka-shi (JP)

( * ) Notice: Subject to any disclaimer, the term of this patent is extended or adjusted under 35 U.S.C. 154(b) by 153 days.

(21) Appl. No.: 15/077,966

(22) Filed: Mar. 23, 2016

(65) Prior Publication Data

US 2016/0279629 A1 Sep. 29, 2016

(30) Foreign Application Priority Data

Mar. 26, 2015 (JP) .................. 2015-064737

(51) Int. Cl.
*H01L 21/677* (2006.01)
*H01L 21/67* (2006.01)

(52) U.S. Cl.
CPC .. *H01L 21/67769* (2013.01); *H01L 21/67017* (2013.01); *H01L 21/67736* (2013.01)

(58) Field of Classification Search
CPC ......... H01L 21/67769; H01L 21/67017; H01L 21/67736
USPC ....................................................... 454/187
See application file for complete search history.

(56) References Cited

U.S. PATENT DOCUMENTS

| | | | | |
|---|---|---|---|---|
| 4,666,477 A * | 5/1987 | Lough | ............... | B01D 46/10 137/625.3 |
| 6,251,155 B1 * | 6/2001 | Fukushima | ............ | B01D 46/00 454/187 |
| 6,332,744 B1 * | 12/2001 | Fukushima | ............ | B65G 1/045 414/283 |
| 2014/0109516 A1 * | 4/2014 | Tominaga | ......... | H01L 21/67393 53/432 |
| 2014/0363258 A1 | 12/2014 | Iwamoto et al. | | |
| 2015/0004899 A1 | 1/2015 | Otsuka et al. | | |
| 2016/0358799 A1 * | 12/2016 | Murata | ............. | H01L 21/67389 |

FOREIGN PATENT DOCUMENTS

| | | |
|---|---|---|
| JP | 543543 U | 6/1993 |
| JP | 10172873 A | 6/1998 |
| JP | 2014239096 A | 12/2014 |
| JP | 20159912 A | 1/2015 |

* cited by examiner

*Primary Examiner* — Steven B McAllister
*Assistant Examiner* — Allen Schult
(74) *Attorney, Agent, or Firm* — The Webb Law Firm

(57) ABSTRACT

A storage facility for semiconductor containers is provided. The storage structure has partitioning walls including a side wall portion extending along a vertical direction, and holding space partitioned off from exterior space by the partitioning walls. Inactive gas enriched air, which contains higher concentration of inactive gas than concentration of inactive gas contained in air in the exterior space, is supplied to the holding space. A first opening for allowing containers being carried into and out of the storage structure to be moved through the side wall portion is formed in the side wall portion. A first inlet opening is located at a position in the exterior space and adjacent an edge of the first opening. A first drawing-in device is provided to discharge air drawn in through the first inlet opening into discharge space which is outside the holding space and is divided off from the exterior space.

10 Claims, 6 Drawing Sheets

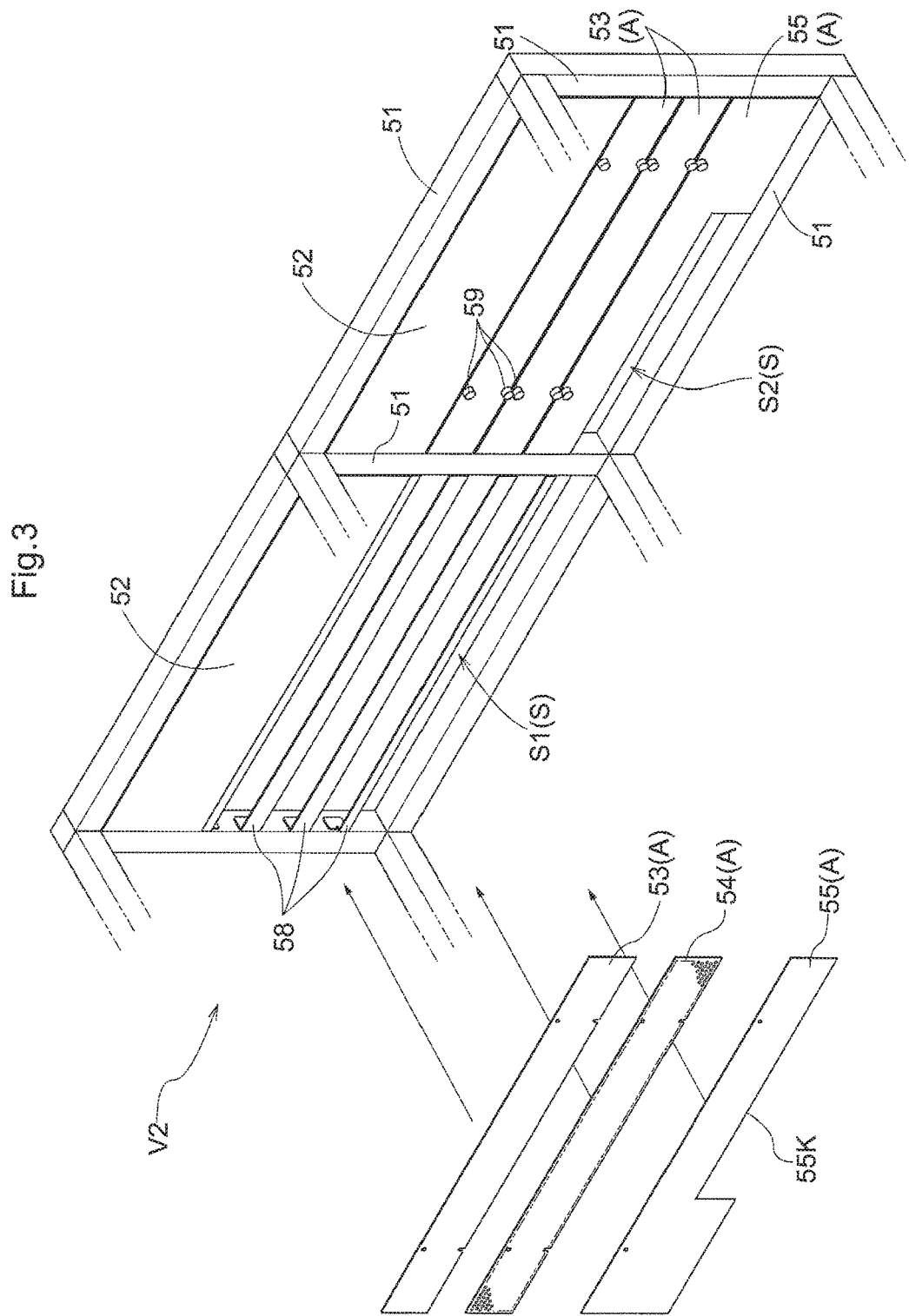

Fig.5

| Opening area ratio (%) | Panels A used | | |
|---|---|---|---|
| | First Panels 53 (With no holes) | Second Panels 54 (With holes) | Third Panels 55 (Only for lowermost portion) |
| 70.3 | 0 | 0 | 0 |
| 60.7 | 0 | 1 | 0 |
| 50.8 | 0 | 2 | 0 |
| 45.9 | 1 | 0 | 0 |
| 41.2 | 0 | 3 | 0 |
| 38.0 | 2 | 0 | 0 |
| 34.5 | 1 | 2 | 0 |
| 28.0 | 2 | 1 | 0 |
| 21.5 | 3 | 0 | 0 |
| 15.3 | 2 | 0 | 1 |

STORAGE FACILITY FOR SEMICONDUCTOR CONTAINERS

CROSS-REFERENCE TO RELATED APPLICATION

This application claims priority to Japanese Patent Application No. 2015-065737 filed Mar. 26, 2016, the disclosure of which is hereby incorporated in its entirety by reference.

FIELD OF THE INVENTION

The present invention relates to a storage facility for semiconductor containers comprising a storage structure for storing containers for holding one or more semiconductor substrates, wherein the storage structure has partitioning walls including a side wall portion extending along a vertical direction, and holding space partitioned off from exterior space by the partitioning walls, wherein inactive gas enriched air, which contains higher concentration of inactive gas than concentration of inactive gas contained in air in the exterior space, is supplied to the holding space, wherein a first opening for allowing containers being carried into and out of the storage structure to be moved through the side wall portion is formed in the side wall portion.

BACKGROUND

In a storage structure in a storage facility for semiconductor containers such as the one described above, inactive gas is supplied, in some cases, into the interior space of the containers stored in the holding space, or to a storage location, which can be opened and closed, for storing the containers within the holding space, in order to lower the oxygen concentration in the areas surrounding the semiconductor substrates to reduce deterioration of semiconductor substrates in the containers due to oxidization. In such cases, because the inactive gas in the containers or in the storage locations flows out into the holding space, the concentration of the inactive gas in the air in the holding space is higher than the concentration of the inactive gas contained in the air in the exterior space outside of the holding space.

In addition, since the purpose of the storage structure is to temporarily store containers until they are ready to be processed by processing devices etc. provided in the exterior space, or to be carried out, the storage structure needs to be configured such that containers can be carried out to, and carried in from, the exterior space. For this purpose, a first opening for allowing containers being carried into or out of the storage structure to pass or be moved through is formed in a partitioning wall. When such an opening exists, there is a possibility that air in the holding space, whose inactive gas concentration is relatively high, may flow out to the exterior space.

On the other hand, since a worker may work in the exterior space, it is preferable to prevent the air in holding space from flowing out to the exterior space to the extent possible, in order to maintain a safe work environment.

To this end, as disclosed in, for example, JP Publication of Application No. H10-172873 (Patent Document 1), a storage structure is proposed in which the conveyance port 18 (first opening) has a door which can be opened and closed to prevent the air in the holding space from flowing out to the exterior space.

SUMMARY OF THE INVENTION

Although there is no detailed description about the door of the conveyance port 18 in Patent Document 1, when arrangements are made so that, for example, the containers are transported between the storage structure and other locations by means of a self-propelling transport device etc., it would be necessary to automatically open and close the door of the conveyance port 18. In this case, it is necessary to provide, for example, an actuator for opening and closing the door as well as a controller for controlling the opening and closing of the door, which may result in increased complexity and cost of structure of the storage structure.

Thus, a storage facility for semiconductor containers is desired in which the amount of air that flows from the holding space out to the exterior space can be reduced while avoiding increase in complexity and cost of structure of the storage.

In light of the above, a storage facility for semiconductor containers comprises: a storage structure for storing containers for holding one or more semiconductor substrates, wherein the storage structure has partitioning walls including a side wall portion extending along a vertical direction, and holding space partitioned off from exterior space by the partitioning walls, wherein inactive gas enriched air, which contains higher concentration of inactive gas than concentration of inactive gas contained in air in the exterior space, is supplied to the holding space, wherein a first opening for allowing containers being carried into and out of the storage structure to be moved through the side wall portion is formed in the side wall portion, wherein a first inlet opening is located at a position which is in the exterior space and is adjacent an edge of the first opening, and wherein a first drawing-in device is provided to discharge air drawn in through the first inlet opening into discharge space which is outside the holding space and is divided off from the exterior space.

That is, when air in the holding space (i.e., air containing relatively high concentration inactive gas) is about to flow out or escape to the exterior space through the first opening, air that is about to flow out to the exterior space or air that has once flowed out of the first opening out to the exterior space would be drawn in through the inlet opening located at the position adjacent an edge of the first opening by the drawing-in action of the first drawing-in device. And the air drawn in through the first inlet opening is discharged, or moved, into the discharge space which is outside the holding space and is divided off from the exterior space. This makes it possible to reduce the amount of air around the first opening that flows out to the exterior space.

Thus, this arrangement makes it possible to reduce the amount of air in the holding space that flows out to the exterior space without having to provide a door to the first opening that can be opened and closed.

Thus, a storage facility for semiconductor containers can be provided in which the amount of air in the holding space that flows out to the exterior space can be reduced while avoiding increase in complexity and cost of structure of the storage.

BRIEF DESCRIPTION OF THE DRAWINGS

FIG. 3 is a perspective view showing second inlet opening and opening amount adjusting panels attached thereto, FIG. 4(*a*), FIG. 4(*b*), and FIG. 4(*c*) show different patterns for attaching opening amount adjusting panels, FIG. 5 shows a table showing a relationship between the attaching patterns of the opening amount adjusting panels and opening area ratios.

DETAILED DESCRIPTION

Embodiments of a storage facility for semiconductor containers are described next with reference to the drawings.

Figure 1:
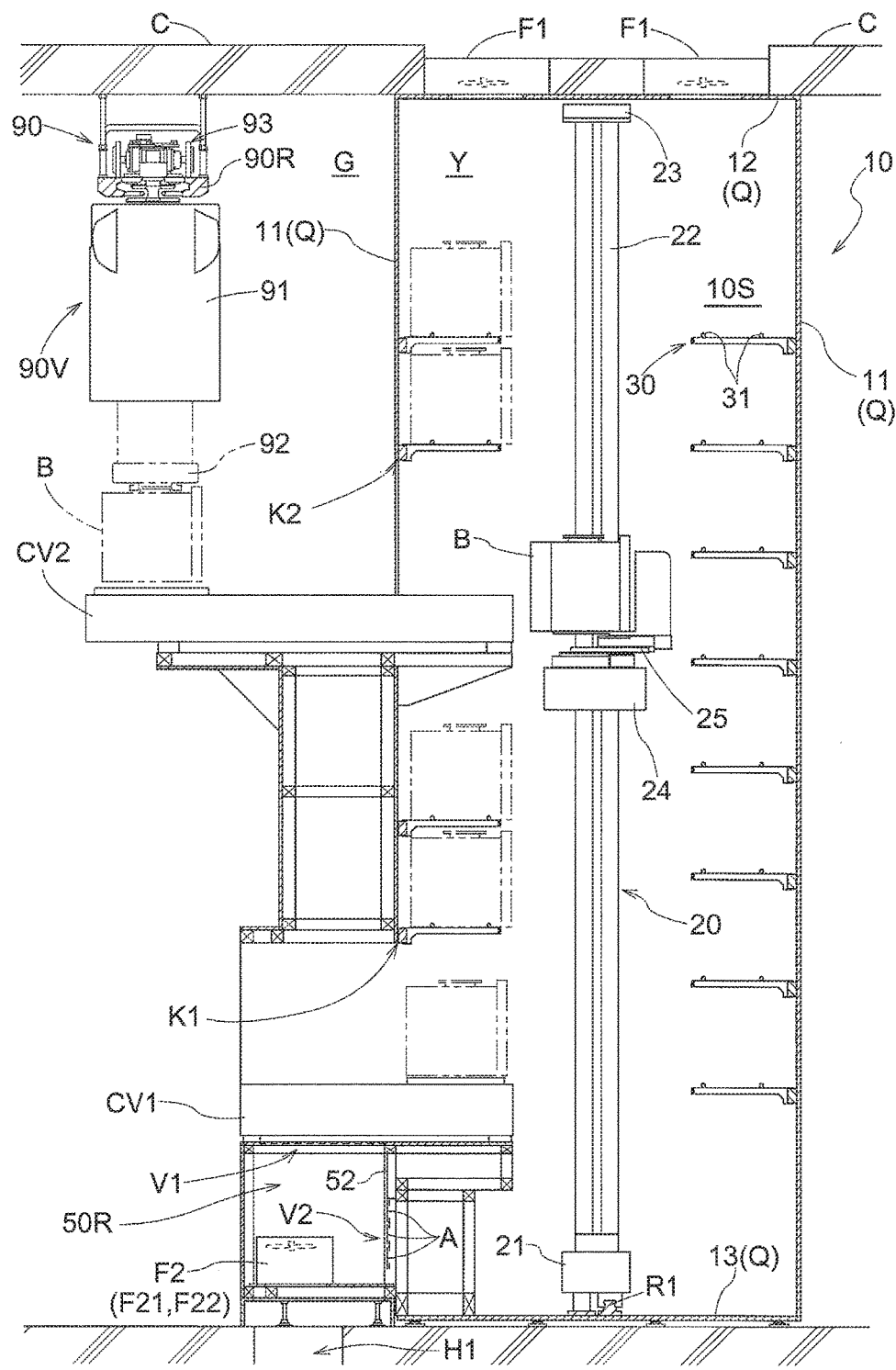
FIG. 1 is a side view sectional drawing of a storage structure.

As shown in FIG. 1, the storage facility for semiconductor containers of the present embodiment includes a storage structure 10 for storing a plurality of containers B (FOUPs) for holding or carrying semiconductor substrates, such that the containers B are arranged one above another in a vertical direction.

The storage structure 10 includes partitioning walls Q, and holding space Y, and an inactive gas enriching air supply portion. The partitioning walls Q include side wall portions 11 extending along the vertical direction, an upper base portion 12, and a lower base portion 13. The holding space Y is partitioned off from the exterior space G by the partitioning walls Q as seen along the vertical direction. An inactive gas enriching air supply portion supplies inactive gas enriched air, which contains higher concentration of inactive gas (nitrogen etc.) than the concentration of inactive gas contained in the air in the exterior space G, to the containers B stored in the holding space Y. In the description and claims, the expression "inactive gas enriched air is supplied to the holding space" means that the inactive gas enriched air is supplied directly or indirectly (i.e., through the containers) to the holding space Y. Such storage structure 10 is installed in clean rooms in a semiconductor manufacturing factory.

In the storage structure 10, a plurality of support portions 30, each of which is for supporting a container B, are provided such that the support portions 30 are arranged one above another along the vertical direction and one next to another along the lateral direction. While not shown, the bottom portion of each container B is provided with a feed opening for introducing inactive gas into the interior accommodating space of the container B, and a discharge opening for discharging or letting out the gas within the interior accommodating space of the container B out of the container B. The support portion 30 has kinematic pins 31 for engaging "engaging grooves" provided in the bottom portion of the container B to support the container B with the container B properly positioned. The space above each support portion 30 functions as storage space 10S for a container B. In addition, an inactive gas feed pipe, which is configured to be connected to the feed opening of the container B to introduce inactive gas into the container B when the container B is supported by the support portion 30, is provided in the support portion 30. By introducing fresh inactive gas from the inactive gas feed pipe, used inactive gas that filled the interior accommodating space of the container B is discharged from the container B out to the holding space Y of the storage structure 10. That is, the inactive gas feed pipe of the support portion 30 is, or functions as, the inactive gas enriching air supply portion in the present embodiment.

In addition, a stacker crane 20 is provided on the front face side of, or in front of, the support portions 30. The stacker crane 20 includes a travel carriage 21 configured to travel on and along a rail R1 installed to extend laterally or along a right and left direction, a vertical movement mast 22 arranged to stand vertically on the travel carriage 21, a vertically movable platform 24 which is vertically movable while being guided by the vertical movement mast 22, and a transfer device 25 which is supported by the vertically movable platform 24, and which is configured to transfer a container B between itself and a transfer target location.

In the storage structure 10, a first opening K1 is formed in a side wall portion 11 to allow containers B being carried into and out of the storage structure 10 to pass or be moved through the side wall portion 11.

A first conveyor CV1 is provided for transporting containers B, one at a time, between the holding space Y and the exterior space G such that the containers B are moved through the first opening K1. In the present embodiment, the first conveyor CV1 includes a carriage type transport member, and a support member for receiving a container B on an upper end of the transport member. The transport member is configured as a carriage-type conveyor which travels along a transporting path portion 41 (see FIG. 2). Alternatively, a roller conveyor may be used as the first conveyor CV1.

While not illustrated, the end portion of the first conveyor CV1 on the exterior space G side is configured to be capable of transferring a container B to and from a self-propelled carriage. In addition, the end portion of the first conveyor CV1 on the holding space Y side is configured to be capable of transferring a container B to and from the transfer device 25 of the stacker crane 20 described above. An intake box 50R for discharging air into an exhaust path H1 is provided below a portion of the first conveyor CV1 that is on the exterior space G side with respect to the side wall portion 11.

This exhaust path H1 is formed in the floor. And this exhaust path H1 (more specifically, the space defined by the exhaust path H1) is, or corresponds to, the discharge space which is outside the holding space Y and which is divided off from the exterior space G.

A fan unit F2 for drawing in air is attached to a lower end of the intake box 50R. And the exhaust path H1 is connected to the discharge side of the fan unit F2.

The space formed between the ceiling C and the floor is divided by the partitioning walls Q into the holding space Y and the exterior space G. The exterior space G is space located at the same height as the holding space Y. The exterior space G and the holding space Y are divided off from each other virtually or physically so that at least flow of air from the discharge space to the exterior space G is prevented or reduced.

More specifically, in the present embodiment, the exterior space G and the discharge space which is the exhaust path H1 are divided off from each other virtually at the height of the upper end of the exhaust path H1 (i.e., height of the top surface of the floor). And any flow of air from the discharge space to the exterior space G is prevented by causing air to flow from the exterior space G to the discharge space by means of the fan unit F2.

Note that an expression "flow of air being prevented" or the like refers to a state in which flow of air from the discharge space to the exterior space G is actively prevented, for example, by causing air to flow from the discharge space toward the exterior space G by means of a fan etc., or by separating the discharge space and the exterior space G from each other by means of a solid plate (i.e., plate with no through holes through which air can flow or move), or by separating the discharge space and the exterior space G from each other by means of an air curtain, among other ways. In addition, an expression "flow of air being reduced" or the like refers to a state in which, for example, by separating the discharge space and the exterior space G from each other by means of a porous plate (i.e., plate with many through holes through which air can flow or move), the flow of air from the discharge space to the exterior space G is reduced compared with the case where the discharge space and exterior space G are not partitioned off from each other by a porous plate.

In addition, a floor may be formed of a porous plate to physically divide or partition the exterior space G defined above the porous plate off from the space defined below the porous plate to utilize the space defined below the porous plate as the discharge space. Thus, flow of air from the discharge space to the exterior space G can be reduced in this manner, i.e., by separating the exterior space G and the discharge space from each other by means of a porous plate. And when the exterior space G and the discharge space are partitioned off from each other in this manner by a porous plate, any flow of air from the discharge space into the exterior space G may be prevented by providing a fan unit to the ceiling C and thereby creating a downward flow of air which flows from the exterior space G into the discharge space through the porous plate.

In addition, the space formed between the ceiling C and the floor may divided into the holding space Y, the exterior space G, and the discharge space by providing porous plates or solid plates that extend from the ceiling C to the floor on the outside of the holding space Y in the space between the ceiling C and the floor, or by forming air curtains. In this case, it is preferable to make the divisions such that the workspace in which a worker works is not included in the discharge space.

In the present embodiment, fan units F1 are, or correspond to, the downward air flow forming portions. In other words, the fan units F1 are provided, at a higher position than the first opening K1 in the holding space Y, to function as downward air flow forming portions to cause air in the holding space Y to flow downward thus to create or form a downward air flow in the holding space Y.

In addition, a second opening K2 for allowing the containers B being carried into and out of the storage structure 10 to pass or be moved through is formed at a position higher than the first opening K1 and lower than the fan units F1. A second conveyor CV2 is provided for transporting containers B, one at a time, between the holding space Y and the exterior space G such that the containers B are moved through the second opening K2.

An end portion of the second conveyor CV2 on the exterior space G side is configured to be capable of transferring a container B to and from the ceiling or overhead transport vehicle 90V of the ceiling transport facility 90. The ceiling or overhead transport vehicle 90V includes a travel portion 93 configured to travel on and along travel rails 90R which are suspended from and supported by the ceiling C, a main body portion 91 which is supported by the travel portion 93 and is moved integrally with the travel portion 93 along the travel rails 90R, and a vertically movable member 92 supported by the main body portion 91 such that the vertically movable member 92 can be vertically moved, or raised and lowered. The vertically movable member 92 is configured to be able to grip or hold a flange portion provided at an upper end of the container B. In addition, an end portion of the second conveyor CV2 on the holding space Y side is configured to be capable of transferring a container B to and from the transfer device 25 of the stacker crane 20 described above.

Figure 2:
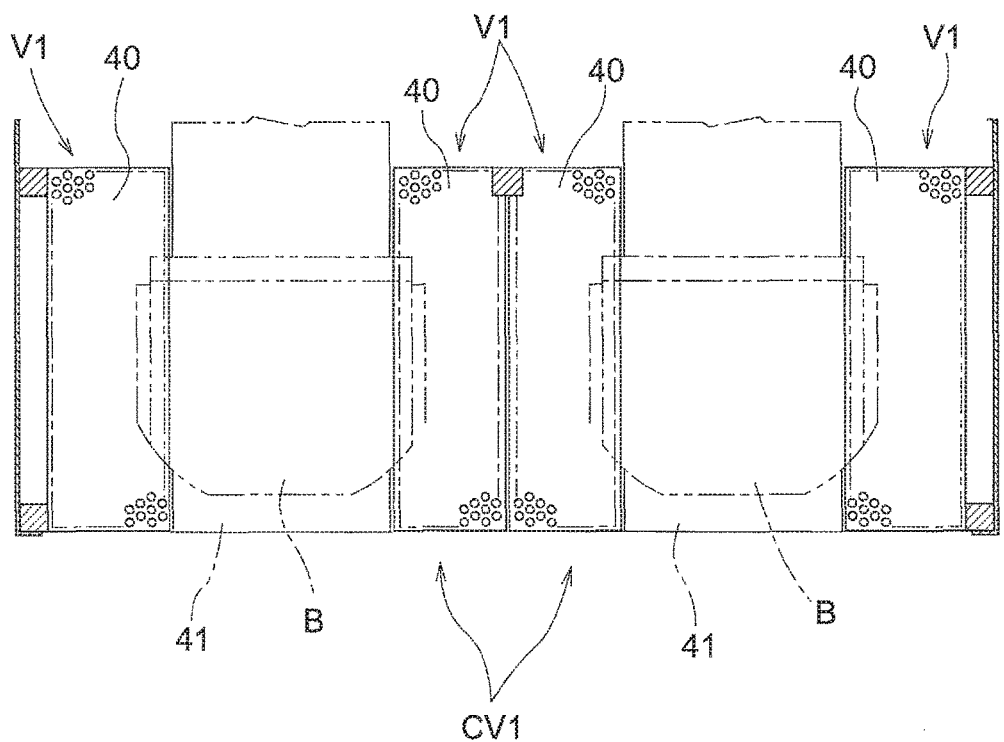
FIG. 2 is a plan view showing first conveyor and first inlet opening.

FIG. 2 is a plan view of the first conveyor CV1. As shown in FIG. 2, a number of punching panels 40, with a plurality of through holes through which air can flow, are attached on both sides, along a direction perpendicular to the transporting direction, of the first conveyor CV1 and at the top of the intake box 50R.

As shown in FIG. 3, fixed dividing plates 52 are attached to the side face of the intake box 50R that is on the side of the holding space Y. In addition, an opening portion S is formed and defined as a portion of the side face of the intake box 50R that is on the side of the holding space Y and that is not covered by the fixed dividing plates 52. The opening portion S is divided into a right hand side portion and a left hand side portion by a frame member 51. In the present embodiment, the opening portion S is divided into a first opening portion S1 and a second opening portion S2 such that the first and second opening portions S1, S2 are located next to each other in the lateral, or right and left, direction. The second opening portion S2 is formed to have the same lateral width as the first opening portion S1. Three fixing members 58 are attached to each of the first opening portion S1 and the second opening portion S2 such that the opening portion S is divided into four equal portions arranged along the vertical direction. Hereinafter, the vertical dimension of one of the four equally divided portions of the opening portion S will be referred to as a "unit of opening height". The three fixing members 58 are positioned such that the vertical distance between any two vertically adjacent fixing members 58 is nearly the same for all such pairs. In addition, opening amount adjusting panels A can be removably attached to the fixing members 58 by means of bolts 59.

As shown in FIG. 3, the opening amount adjusting panels A include first plate-shaped panels 53, second plate-shaped panels 54, and third plate-shaped panels 55. Each of the first panels 53 has a vertical dimension of one unit of opening height, and is formed such that its lateral width is half the width, along the lateral direction, of the opening portion S (i.e., the lateral width of each first panel 53 is the same as the lateral width of the first opening portion S1 or the second opening portion S2), and has no holes formed therein through which air can flow. Each of the second panels 54 has a vertical dimension of one unit of opening height, and is formed such that its lateral width is half the width, along the lateral direction, of the opening portion S, and has through holes formed therein through which air can flow. Each of the third panels 55 has a vertical dimension of two units of opening height, and is formed such that its lateral width is half the width, along the lateral direction, of the opening portion S, and has no holes formed therein through which air can flow, and, further, has a cutout portion 55K formed in a portion thereof. Of these first panels 53, second panels 54, and third panels 55, the third panels 55 are used only for the lowermost portion of the opening portion S.

Figure 4A:
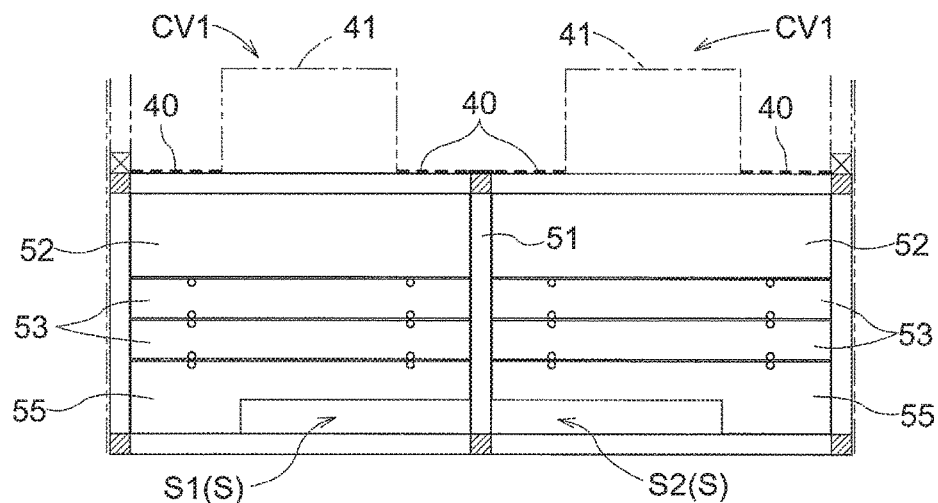
Figure 4B:
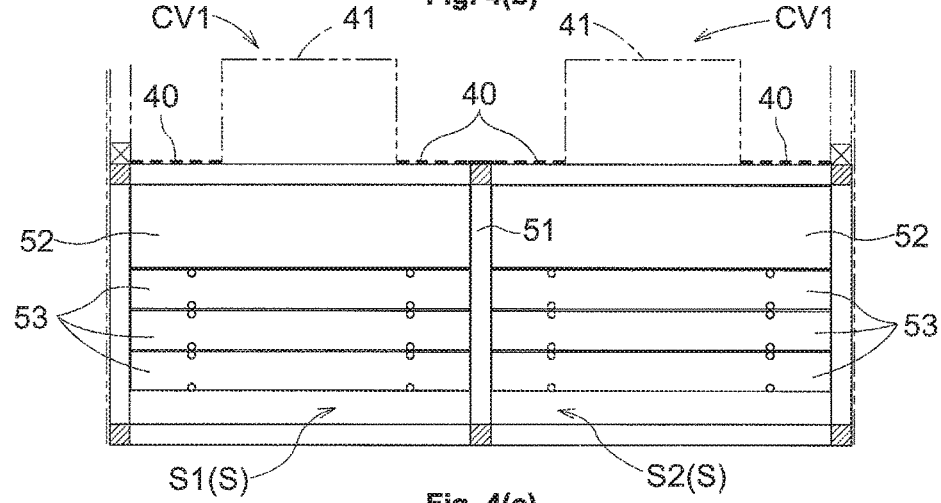
Figure 4C:
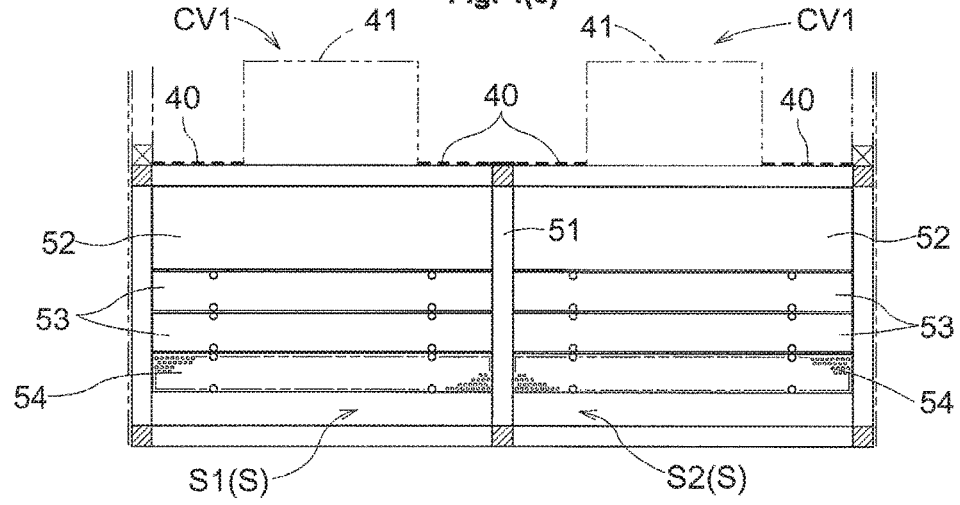

FIG. 4 shows attaching patterns of the opening amount adjusting panels A. In the description, expressions stating panels being attached to opening portions are used for convenience when these expressions mean that the panels are attached to fixing members 58 and/or the frame member 51 associated with the opening portions. The same interpretation may apply to similar expressions depending on the context. Note that, in the present embodiment, the opening amount adjusting panels A are attached to each of the first opening portion S1 and the second opening portion S2 in the same pattern; however, the opening amount adjusting panels A may be attached to the first opening portion S1 and the second opening portion S1 in different patterns for the portions S1, S2.

FIG. 4 (a) shows an example in which two first panels 53 and one third panel 55 are attached to each of the first opening portion S1 and the second opening portion S2. In this case, as shown in FIG. 5, the ratio of the opening area to the total area of the opening portion S is 15.3%.

FIG. 4 (b) shows an example in which three first panels 53 are attached to each of the first opening portion S1 and the second opening portion S2. In this case, as shown in FIG. 5, the ratio of the opening area to the total area of the opening portion S is 21.5%.

FIG. 4 (c) shows an example in which two first panels 53 and one second panel 54 are attached to each of the first opening portion S1 and the second opening portion S2. In this case, as shown in FIG. 5, the ratio of the opening area to the total area of the opening portion S is 28.0%.

Thus, the ratio of the opening area to the total area of the opening portion S can be changed by changing the attaching pattern of the first panels 53, the second panels 54, and the third panels 55, as shown in FIG. 5. Note that FIG. 5 shows the number of the opening amount adjustment panels A used to cover one opening portion (for example, the first opening portion S1).

Activating the fan unit F2 causes the air in the intake box 50R to be discharged into the exhaust path H1 so that there is negative pressure within the intake box 50R. This causes air above the punching panels 40 to be drawn into the intake box 50R through the through holes in the punching panels 40. This also causes air in the holding space Y to be drawn into the intake box 50R through the opening portion S (or the remaining portion of the opening portion S that is not closed by the opening amount adjusting panels A). In other words, air is drawn in from the both the first inlet opening V1 and the second inlet opening V2 by the drawing-in action of the fan unit F2.

Here, since the ratio of the through openings to the total area of the punching panels 40 is fixed, the flow pass cross sectional area of the flow pass of air from the first inlet opening V1 to the fan unit F2 cannot be changed. However, the flow pass cross sectional area of the flow pass of air from the second inlet opening V2 to the fan unit F2 can be adjusted by attaching or detaching the opening amount adjusting panels A.

Thus, in the present embodiment, by changing or adjusting the pattern for attaching the opening amount adjusting panels A as shown in FIG. 3-FIG. 5, the flow pass cross sectional area of the flow of air from the second inlet opening V2 to the fan unit F2 adjusted by the opening amount adjusting panels A is set such that the flow speed of the downward air flow formed in the space in the holding space Y and close to the first opening K1 is greater than the flow speed of air that flows from the first inlet opening V1 into the fan unit F2.

In the present embodiment, the portions at the upper end of the intake box 50R where the punching panels 40 are provided is, or corresponds to, collectively the first inlet opening V1 whereas the opening portion S of the side face of the intake box 50R that is on the side of the holding space Y is, or corresponds to, the second inlet openings V2.

In addition, in the present embodiment, the first drawing-in device F21 and the second drawing-in device F22 consist of the fan unit F2 which functions as both the first drawing-in device F21 and the second drawing-in device F22. That is, first drawing-in device F21 which discharges air drawn in through the first inlet opening V1 to the exhaust path H1 outside the holding space Y and second drawing-in device F22 which discharges air drawn in through the second inlet opening V2 to the exhaust path H1 outside the holding space Y are provided; and, one drawing-in device functions as both the first drawing-in device F21 and the second drawing-in device F22.

In addition, the first inlet opening V1 is located at a position which is in the exterior space G and is adjacent an edge of the first opening K1. In addition, the second inlet opening V2 which opens to the holding space Y is formed in the side wall portion 11 at a lower position than the first opening K1.

In addition, the first drawing-in device F21 and the second drawing-in device F22 are set or configured such that the flow speed of the downward air flow formed in the space in the holding space Y and next to the first opening K1 is greater than the flow speed of air drawn in by the first drawing-in device F21 by changing or adjusting the pattern for attaching the opening amount adjusting panels A.

In addition, in the present embodiment, the opening amount adjusting panels A are, or correspond to the adjusting device for adjusting the flow pass cross sectional area. More specifically, an adjusting device for adjusting the flow pass cross sectional area is provided in at least one of the flow path of air from the first inlet opening V1 to the first drawing-in device F21 and the flow path of air from the second inlet opening V2 to the second drawing-in device F22 such that the adjusting device is removably provided to the second inlet opening V2.

Figure 6:
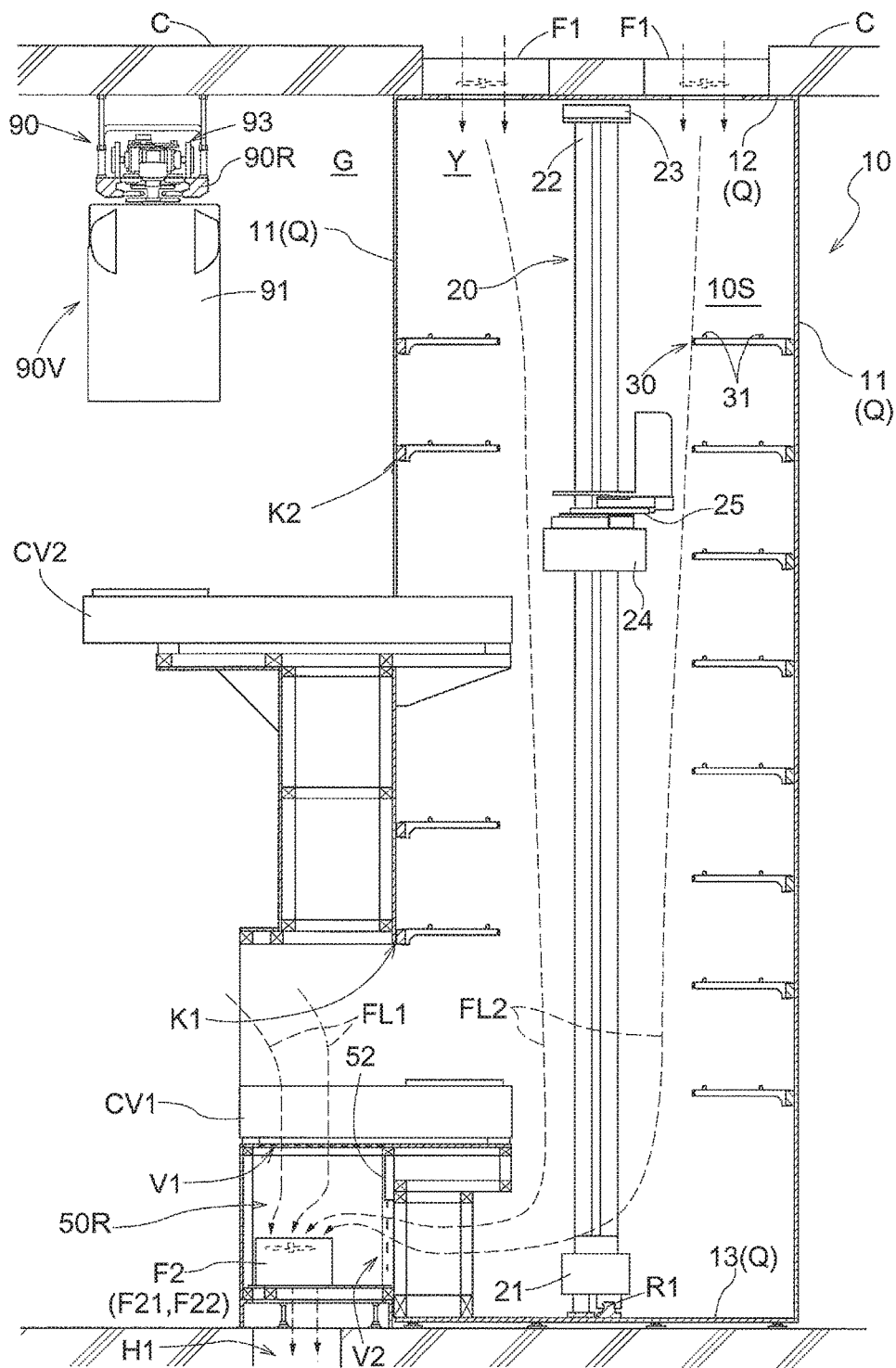
FIG. 6 shows air flow in exterior space and in holding space.

With such structure, as shown in FIG. 6 with dotted lines FL2, air in the holding space Y is drawn into the second inlet opening V2 so that downward air flow is formed in the space in the holding space Y and close to the first opening K1. Thus, air in the holding space Y can be prevented from flowing out of the first opening K1 and into the exterior space G.

In addition, air in the exterior space G and adjacent an edge of the first opening K1 is drawn in through the first inlet opening V1, as shown with broken lines FL1. Thus, air in the exterior space G can be prevented from flowing into the holding space Y through the first opening K1; therefore, the semiconductor substrates in the containers B can be prevented from being contaminated by the air in the exterior space G containing more particles of impurity, or contaminating particles, than air in the holding space Y of the storage structure 10.

[Alternative Embodiments]

(1) In the embodiment described above, an arrangement is described in which the opening amount adjusting panels A, which function as the adjusting device, are attached to the second inlet opening V2; however, the invention is not limited to such arrangement. An arrangement may be made in which an adjusting device is attached to the first inlet opening V1 instead. In addition, an individual adjusting device may be provided and attached to each of the first inlet opening V1 and the second inlet opening V2.

(2) In the embodiment described above, the opening amount adjusting panels A are configured such that a desired opening area ratio is obtained by combining the panels having different opening area ratios, such as the first panels 53 in which no holes are formed and the second panels 54 in which through holes are formed; however, the invention is not limited to such arrangement. The opening amount adjusting panels A may be panels each having a surface area that covers the entire opening portion S. And one of the panels having different opening area ratios may be attached to the opening portion S.

(3) In the embodiment described above, an example is described in which the adjusting device is the opening amount adjusting panels A removably attached to the opening portion S of the second inlet opening V2; however, the invention is not limited to such arrangement. For example, a fan-shaped opening and a fan-shaped closing plate which can cover, or overlap with, the opening may be provided. And the amount of overlap between the opening and the closing plate is adjusted by rotating the closing plate about its pivot point of the fan-shape as the pivot axis. Alternatively, Two plate-shaped members each having a plurality of slits may be placed with one next to the other. And the total area of the through openings formed by the slits of the two plate-shaped members may be adjusted by sliding the two plate-shaped members with respect to each other.

(4) In the embodiment described above, an arrangement in which the drawing-in device is the fan unit F2 is described. However, a vacuum pump, such as a rotary pump or a diffusion pump, for example, may be used as the drawing-in device.

(5) In the embodiment described above, an arrangement in which one drawing-in device (fan unit F2) functions as both the first drawing-in device F21 and the second drawing-in device F22 is described; however, the invention is not limited to such arrangement. For example, the first drawing-in device F21 and the second drawing-in device F22 may be two separate fan units. In such case, the adjusting device can be provided in which the drawing-in-power, or the suction force, of the fan unit that functions as the first drawing-in device F21 and of the fan unit that functions as the second drawing-in device F22 may be adjusted individually. In addition, the discharge space into which the fan unit that functions as the first drawing-in device F21 discharges air may be provided separately from the discharge space into which the fan unit that functions as the second drawing-in device F22 discharges air.

(6) In the embodiment described above, an arrangement is described in which the first inlet opening V1 is formed in the top surface of the intake box 50R and in which the second inlet opening V2 is formed in a side face of the intake box 50R. However, one or both of the first inlet opening V1 and the second inlet opening V2 may be an opening or openings at one end of a duct pipe whose the other end is connected to the drawing-in device.

(7) In the embodiment described above, an example is described in which the fan units F1 (downward air flow forming portions) are provided at a higher position than the first opening K1 in the holding space Y, to cause air in the holding space Y to flow downward to create or form a downward air flow in the holding space Y. The arrangement may be such that the fan units F1 are not provided. In such case, a downward air flow would be formed in the holding space Y by drawing in air in the holding space Y into the second inlet opening V2 provided near the bottom of the holding space Y.

(8) In the embodiment described above, the second opening K2 is formed at a position that is higher than the first opening K1 and is lower than the fan units F1, for allowing the containers B being carried into or out of the storage structure 10 to passed or moved through. However, the storage structure may be one that does not have the second opening K2.

[Summary of Embodiments Described Above]

A brief summary of the storage facility for semiconductor containers described above is provided next.

A storage facility for semiconductor containers comprises: a storage structure for storing containers for holding one or more semiconductor substrates; wherein the storage structure has partitioning walls including a side wall portion extending along a vertical direction, and holding space partitioned off from exterior space by the partitioning walls, wherein inactive gas enriched air, which contains higher concentration of inactive gas than concentration of inactive gas contained in air in the exterior space, is supplied to the holding space, wherein a first opening for allowing containers being carried into and out of the storage structure to be moved through the side wall portion is formed in the side wall portion, wherein a first inlet opening is located at a position which is in the exterior space and is adjacent an edge of the first opening, and wherein a first drawing-in device is provided to discharge air drawn in through the first inlet opening into discharge space which is outside the holding space and is divided off from the exterior space.

That is, when air in the holding space (i.e., air containing relatively high concentration inactive gas) is about to flow out or escape to the exterior space through the first opening, air that is about to flow out to the exterior space or air that has once flowed out of the first opening out to the exterior space would be drawn in through the inlet opening located at the position adjacent an edge of the first opening by the drawing-in action of the first drawing-in device. And the air drawn in through the first inlet opening is discharged or moved into the discharge space which is outside the holding space and is divided off from the exterior space. This makes it possible to reduce the amount of air around the first opening that flows out to the exterior space.

Thus, this arrangement makes it possible to reduce the amount of air in the holding space that flows out to the exterior space without having to provide a door to the first opening that can be opened and closed.

Thus, a storage facility for semiconductor containers can be provided in which the amount of air in the holding space that flows out to the exterior space can be reduced while avoiding increase in complexity and cost of structure of the storage.

In addition, a downward air flow forming portion is preferably provided at a higher position than the first opening in the holding space, to cause air in the holding space to flow downward to form a downward air flow in the holding space, wherein a second inlet opening which opens to the holding space is preferably formed in the side wall portion at a lower position than the first opening, and wherein a second drawing-in device is preferably provided to discharge air drawn in through the second inlet opening into the discharge space.

That is, a downward flow of air can be formed or created in the holding space by causing the air in the holding space to flow downward by means of the downward air flow forming portion and by drawing in air in the holding space through the second inlet opening located at a lower position than the first opening, by means of the drawing-in device to discharge the air to the discharge space.

At this time, there is a possibility that the air pressure in holding space may increase if the amount of air discharged out of the holding space by the second drawing-in device is less than the amount of air that is caused to flow downward by the downward air flow forming portion. And if the air pressure in the holding space becomes greater than the air pressure of exterior space, air in the holding space may flow out of the first opening and out to the exterior space.

Even in such a case, air that is about to flow out to the exterior space from the first inlet opening located at a position adjacent an edge of the first opening or air that has once flowed out of the first opening and out to the exterior space can be drawn in through the first opening by the drawing in action of the first drawing-in device; thus, the amount of air in the holding space that flows out to the exterior space can be reduced.

The first drawing-in device and the second drawing-in device are preferably configured such that a flow speed of the downward air flow formed in space in the holding space and close to the first opening is greater than a flow speed of air that is drawn in by the fist drawing-in device.

That is, with this arrangement, because of the difference between the flow speed of the downward air flow formed in space in the holding space and close to the first opening and the flow speed of air that is drawn in by the fist drawing-in device, air that the first drawing-in device draws is pulled by and toward the downward flow of air with higher speed. Thus, the air in the holding space would not flow out to the exterior space through the first opening. In addition, because air that flows in toward the holding space from the exterior space is drawn in through the first inlet opening and is discharged to a location outside the holding space, air in the exterior space would not flow into the holding space.

As such, incidents of air in the holding space flowing out to the exterior space or of air in the exterior space flowing into the holding space are properly reduced without having to provide a door to the first opening.

It is preferable that one drawing-in device functions as both the first drawing-in device and the second drawing-in device.

That is, by providing the one drawing-in device that functions as both the first drawing-in device and the second drawing-in device, drawing in of air in space near the first opening through the first opening and drawing in of air in the holding space through the second opening can be both accomplished while reducing any increase in the number of drawing-in devices. This facilitates reduction in the costs of the devices.

An adjusting device for adjusting flow pass cross sectional area is preferably provided in at least one of a flow path of air from the first inlet opening to the first drawing-in device and a flow path of air from the second inlet opening to the second drawing-in device.

In order to cause the flow speed of the downward air flow formed in space in the holding space and close to the first opening to be greater than the flow speed of air that is drawn in by the fist drawing-in device as described above, it is necessary to adjust a ratio between the flow rate of air that is drawn in through the first inlet opening and the flow rate of air that is drawn in through the second inlet opening.

On the other hand, when one drawing-in device functions as both the first drawing-in device and the second drawing-in device, the ratio of the flow rates described above cannot be adjusted, unlike the case where two separate drawing-in devices are provided with one functioning as the first drawing-in device and the other functioning as the second drawing-in device, in which the ratio of the flow rates can be adjusted by adjusting the ratio of the drawing-in capacities (flow rate of gas or air moved by the device per unit time) of the drawing-in devices.

Thus, the ratio between the flow rate of air that is drawn in through the first inlet opening and the flow rate of air that is drawn in through the second inlet opening can be adjusted by changing the ratio between the flow pass cross sectional area of the flow path of air from the first inlet opening to the first drawing-in device and the flow pass cross sectional area of the flow path of air from the second inlet opening to the second drawing-in device.

The adjusting device is preferably removably provided to at least one of the first inlet opening and the second inlet opening.

More specifically, when an adjusting device is attached to each of the first inlet opening and the second inlet opening, then, in order to change the ratio of the flow pass cross sectional areas to adjust the amount of air drawn in through the first inlet opening and the amount of air drawn in through the second inlet opening, the flow pass cross sectional areas for both inlet openings need to be adjusted and fine-tuned in order to achieve the desired ration, which may be a complicated task for a worker.

Thus, by providing the adjusting device to only one of the first inlet opening and the second inlet opening so that the other inlet opening has a fixed intake flow rate, calculations and adjustments would be simplified when adjusting the ratio of the drawing in flow rates, making it easier to perform this task.

A second opening for allowing containers being carried into and out of the storage structure to be moved through is preferably formed at a position higher than the first opening and lower than the downward air flow forming portion.

More specifically, in a semiconductor processing facility, containers in some cases are transported by transport devices that travel high above the floor and near the ceiling, such as ceiling or overhead transport vehicles, etc. Even in such cases, by forming the second opening at a position higher than the first opening and lower than the downward air flow forming portion, containers can be carried in and out of the storage structure at a location near the height at which the ceiling transport vehicles transport containers.

In addition, even if no door is provided in the second opening, air in the holding space can be prevented from flowing out to the exterior space through the second opening between the holding space and the exterior space, by adjusting the speed of the downward air flow in the holding space.

DESCRIPTION OF REFERENCE NUMERALS AND SYMBOLS

10 Storage structure
11 Side wall portion
A Opening amount adjusting panel (Adjusting device)
B Container
F1 Fan unit (Downward air flow forming portion)
F2 Fan unit (Drawing-in device, First drawing-in device, Second drawing-in device)
G Exterior space
K1 First opening
K2 Second opening
V1 First inlet opening
V2 Second inlet opening
Y Holding space

What is claimed is:

1. A storage facility for semiconductor containers comprising:
   a storage structure for storing containers for holding one or more semiconductor substrates;
   wherein the storage structure has partitioning walls including a side wall portion extending along a vertical direction, and a holding space partitioned off from an exterior space by the partitioning walls,
   wherein inactive gas enriched air, which contains a higher concentration of inactive gas than a concentration of inactive gas contained in air in the exterior space, is supplied to the holding space,
   wherein a first opening for allowing containers being carried into and out of the storage structure to be moved through the side wall portion is formed in the side wall portion,
   wherein a first inlet opening is located at a position which is in the exterior space and is adjacent an edge of the first opening, and
   wherein a first drawing-in device is provided to discharge air drawn from the first opening through the first inlet opening into the first drawing-in device and into discharge space which is outside the holding space and is divided off from the exterior space.

2. The storage facility for semiconductor containers as defined in claim 1, wherein a downward air flow forming portion is provided at a higher position than the first opening in the holding space, to cause air in the holding space to flow downward to form a downward air flow in the holding space, wherein a second inlet opening which opens to the holding space is formed in the side wall portion at a lower position than the first opening, and wherein a second drawing-in device is provided to discharge air drawn in through the second inlet opening into the discharge space.

3. The storage facility for semiconductor containers as defined in claim 2, wherein the first drawing-in device and the second drawing-in device are configured such that a flow speed of the downward air flow formed in space in the holding space and close to the first opening is greater than a flow speed of air that is drawn in by the first drawing-in device.

4. The storage facility for semiconductor containers as defined in claim 3, wherein one drawing-in device functions as both the first drawing-in device and the second drawing-in device.

5. The storage facility for semiconductor containers as defined in claim 4, wherein an adjusting device for adjusting flow pass cross sectional area is provided in at least one of a flow path of air from the first inlet opening to the first drawing-in device and a flow path of air from the second inlet opening to the second drawing-in device.

6. The storage facility for semiconductor containers as defined in claim 5, wherein the adjusting device is removably provided to at least one of the first inlet opening and the second inlet opening.

7. The storage facility for semiconductor containers as defined in claim 2, wherein a second opening for allowing containers being carried into and out of the storage structure to be moved through is formed at a position higher than the first opening and lower than the downward air flow forming portion.

8. The storage facility for semiconductor containers as defined in claim 2, wherein a side on which the exterior space exists oppositely to the holding space in the direction in which the container is moved through the first opening is regarded as an exterior space side, and wherein the first inlet opening is extended to the exterior space side from a lower edge of the first opening and is opened upward.

9. The storage facility for semiconductor containers as defined in claim 1, wherein a side on which the exterior space exists oppositely to the holding space in the direction in which the container is moved through the first opening is regarded as an exterior space side, and wherein the first drawing-in device is arranged at a position on the exterior space side which does not overlap the containers stored in the storage structure when viewed from above.

10. The storage facility for semiconductor containers as defined in claim 1, wherein a first conveyor is provided which transports the containers between the holding space and the exterior space through the first opening, wherein a direction which is perpendicular to the transporting direction of the first conveyor when viewed from above is regarded as a width direction, and wherein the first inlet opening is arranged on both sides of the first conveyor in the width direction so as not to overlap the first conveyor.

* * * * *

UNITED STATES PATENT AND TRADEMARK OFFICE
CERTIFICATE OF CORRECTION

PATENT NO. : 10,242,900 B2
APPLICATION NO. : 15/077966
DATED : March 26, 2019
INVENTOR(S) : Daiki Michishita et al.

Page 1 of 1

It is certified that error appears in the above-identified patent and that said Letters Patent is hereby corrected as shown below:

In the Specification

Column 1, Line 8, delete "2015-065737" and insert -- 2015-064737 --

Column 1, Line 8, delete "2016," and insert -- 2015, --

Signed and Sealed this
Twenty-eighth Day of May, 2019

Andrei Iancu
*Director of the United States Patent and Trademark Office*